United States Patent
Yang et al.

(10) Patent No.: US 12,283,514 B2
(45) Date of Patent: Apr. 22, 2025

(54) METHOD AND SYSTEM FOR PROCESSING WAFER

(71) Applicant: TAIWAN SEMICONDUCTOR MANUFACTURING COMPANY LTD., Hsinchu (TW)

(72) Inventors: Sheng-Chun Yang, Tainan (TW); Chih-Lung Cheng, Miaoli County (TW); Yi-Ming Lin, Tainan (TW); Po-Chih Huang, Tainan (TW); Yu-Hsiang Juan, Taichung (TW); Xuan-Yang Zheng, Tainan (TW); Ren-Jyue Wang, Hsinchu (TW); Chih-Yuan Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 731 days.

(21) Appl. No.: 17/461,002

(22) Filed: Aug. 30, 2021

(65) Prior Publication Data
US 2023/0069237 A1   Mar. 2, 2023

(51) Int. Cl.
*H01L 21/687* (2006.01)
*H01L 21/67* (2006.01)
*H01L 21/683* (2006.01)

(52) U.S. Cl.
CPC ...... *H01L 21/687* (2013.01); *H01L 21/67253* (2013.01); *H01L 21/6838* (2013.01)

(58) Field of Classification Search
CPC ........... H01L 21/67253; H01L 21/6838; H01L 21/67017
See application file for complete search history.

(56) References Cited

U.S. PATENT DOCUMENTS

2017/0107629 A1 *   4/2017   Martin .............. H01L 21/67253

FOREIGN PATENT DOCUMENTS

| CN | 110352265 A | * | 10/2019 | ......... C23C 16/4412 |
| KR | 970005335 Y1 | * | 5/1997 | ......... H01L 21/6838 |

* cited by examiner

*Primary Examiner* — Dah-Wei D. Yuan
*Assistant Examiner* — Andrew J Bowman
(74) *Attorney, Agent, or Firm* — WPAT LAW; Anthony King

(57) ABSTRACT

The present disclosure provides a method and a system therefore for processing wafer. The method includes: extracting a first gas from a chamber via a first route; blocking a second route used to be pumped down to chuck a wafer placed in the chamber, wherein the second route connects the chamber and the first route; and providing a second gas via a third route to purge a junction of the first route and the second route.

20 Claims, 17 Drawing Sheets

Providing the second gas via a fourth route to ballast the first route
S1406

Adjusting another valve of the third route to provide the second gas under a specific psi
S1407

FIG. 14B

```
┌─────────────────────────────────────────────────────────┐
│ Providing a first gas into chambers to perform          │
│ depositions of films on wafers received in the chambers │
│                                                   S1501 │
└─────────────────────────────────────────────────────────┘
                             │
                             ▼
┌─────────────────────────────────────────────────────────┐
│ Extracting the first gas from the chambers via a first  │
│ route and pumping down a second route to chuck the      │
│ wafers placed in the chambers                           │
│                                                   S1502 │
└─────────────────────────────────────────────────────────┘
                             │
                             ▼
┌─────────────────────────────────────────────────────────┐
│ Closing a valve of the second route to stop chucking    │
│ the wafers                                              │
│                                                   S1503 │
└─────────────────────────────────────────────────────────┘
                             │
                             ▼
┌─────────────────────────────────────────────────────────┐
│ Open a valve of a third route                           │
│                                                   S1504 │
└─────────────────────────────────────────────────────────┘
                             │
                             ▼
┌─────────────────────────────────────────────────────────┐
│ Purging a join of the first route and the second route  │
│ by a second gas via the third route                     │
│                                                   S1505 │
└─────────────────────────────────────────────────────────┘
```

FIG. 15A

Providing the second gas via a fourth route to ballast the first route
S1506

Adjusting another valve of the third route to provide the second gas under a specific psi
S1507

FIG. 15B

METHOD AND SYSTEM FOR PROCESSING WAFER

BACKGROUND

During some semiconductor manufacturing procedures, the semiconductor wafer needs to be processed in the reaction chamber filled with specific gas. In the reaction chamber, the semiconductor wafer is placed on the platform having the pipe. The semiconductor wafer is chucked by pumping down the pipe. However, byproduct accumulated in some specific places of the pipe may affect the efficiency of pumping down the pipe.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 14A and 14B are flowchart diagrams according to some embodiments of the present disclosure.

FIGS. 15A and 15B are flowchart diagrams according to some embodiments of the present disclosure.

DETAILED DESCRIPTION

Figure 1:
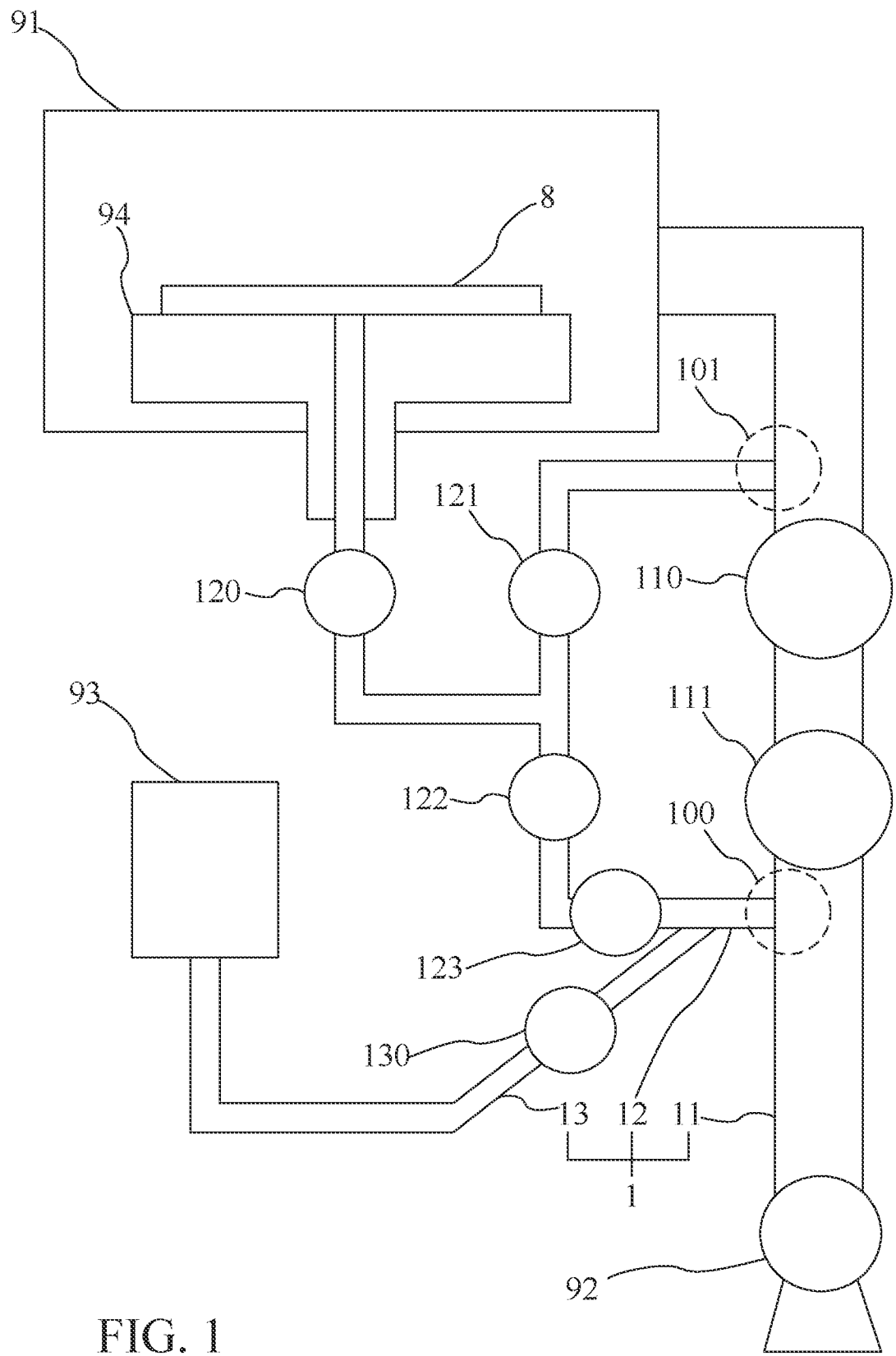
FIG. 1 is a schematic view of processing semiconductor wafer with a system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Referring to FIG. 1 for some embodiments of the present disclosure, FIG. 1 is a schematic view of processing semiconductor wafer with a system 1 according to some embodiments of the present disclosure.

In some embodiments, a chamber 91 may be provided. The chamber 91 may receive a semiconductor wafer 8. The semiconductor wafer 8 may be placed on a platform 94 of the chamber 91. The semiconductor wafer 8 may be processed in the chamber 91. The system 1 may include a first pipe 11, a second pipe 12 and a third pipe 13. The first pipe 11 may connect the chamber 91 and a pump 92. The second pipe 12 may connect the chamber 91 and the first pipe 11. The third pipe 13 may connect the second pipe 12 and a gas source 93.

The first pipe 11 may provide a first route for the gas flow between the chamber 91 and the pump 92. The second pipe 12 may provide a second route for the gas flow between the chamber 91 and the first pipe 11. The third pipe 13 may provide a third route for the gas flow between the second pipe 12 and a gas source 93.

In some embodiments, for controlling the gas flow of the first route, the first pipe 11 may be equipped with valves 110 and 111. The valve 110 of the first pipe 11 may be used as an isolation valve for controlling the isolation of the gas flow between the chamber 91 and the pump 92. The valve 111 of the first pipe 11 may be used as a throttle valve for controlling the flow rate of the gas flow in the first pipe 11.

In some embodiments, for controlling the gas flow of the second route, the second pipe 12 may be equipped with valves 120, 121, 122 and 123. The valve 120 may be used as a chuck valve for controlling the chuck of the semiconductor wafer 8. The valve 121 may be used as a bypass valve 121. The valve 122 may be used as a vacuum valve for controlling whether the second pipe 12 to be pumped down. The valve 123 may be used as a lock valve for preventing gas from reversing back to the chamber 91.

In some embodiments, the third pipe 13 may be equipped with a valve 130. The valve 130 may be used as a lock valve for controlling the pass of the gas from the gas source 93.

In some embodiments, there may be two junctions (i.e., joins) 100, 101 of the first pipe 11 and the second pipe 12. The junction 101 may be close to the chamber 91. The junction 100 may be close to the pump 92. The valves 110 and 111 may be equipped between the junctions 100 and 101. The valve 120 may be equipped between the chamber 91 and the first pipe 11. The valve 121 may be equipped between the junction 101 and the valve 120. The valve 122 may be equipped between the junction 100 and the valve 120. The valve 123 may be equipped between the junction 100 and the valve 122. The valve 130 may be equipped between the junction 100 and the gas source 93.

In some embodiments, the pump 92 may extract gases from the chamber 91 via the first pipe 11. In other words, the first pipe 11 may be configured for the pump 92 to extract gases from the chamber 91. Part of the second pipe 12 may be disposed within the platform 94. When extracting gases from the chamber 91 via the first pipe 11, the pump 92 may pump down the second pipe 12 for chucking the semiconductor wafer 8 placed on the platform 94 in the chamber 91.

While processing the semiconductor wafer 8 in the chamber 91, gases may be provided into the chamber 91 for performing deposition of a film on the semiconductor wafer 8. The deposition may include high aspect ratio process (HARP) in sub-atmosphere chemical vapor deposition (SACVD). During the said semiconductor wafer 8 processing procedures, byproduct may be generated. When the pump 92 extracts the gas from the chamber 91 via the first pipe 11 and pumps down the second pipe 12 for chucking the semiconductor wafer 8, the byproduct may be flowed along the pipes 11 and 12.

In some embodiments, diameter of the second pipe 12 may be less than diameter of the first pipe 11. For instance, the diameter of the first pipe 11 may be about 5 to 7 inches and the diameter of the second pipe 12 may be about 0.5 to 0.7 inches. The byproduct may be accumulated at the junction 100 of the first pipe 11 and the second pipe 12.

In some embodiments, the gas source 93 may provide gas via the third pipe 13 to purge the junction 100 of the first pipe 11 and the second pipe 12 for wiping out the byproduct accumulated at the junction 100. In some implementations, the gas provided from the gas source 93 may include nitrogen. One end of the third pipe 13 may be adjacent to the junction 100 of the first pipe 11 and the second pipe 12. According to different stages during the semiconductor wafer 8 processing procedures, the valves of the pipes may be opened or closed for different purposes.

Figure 2:
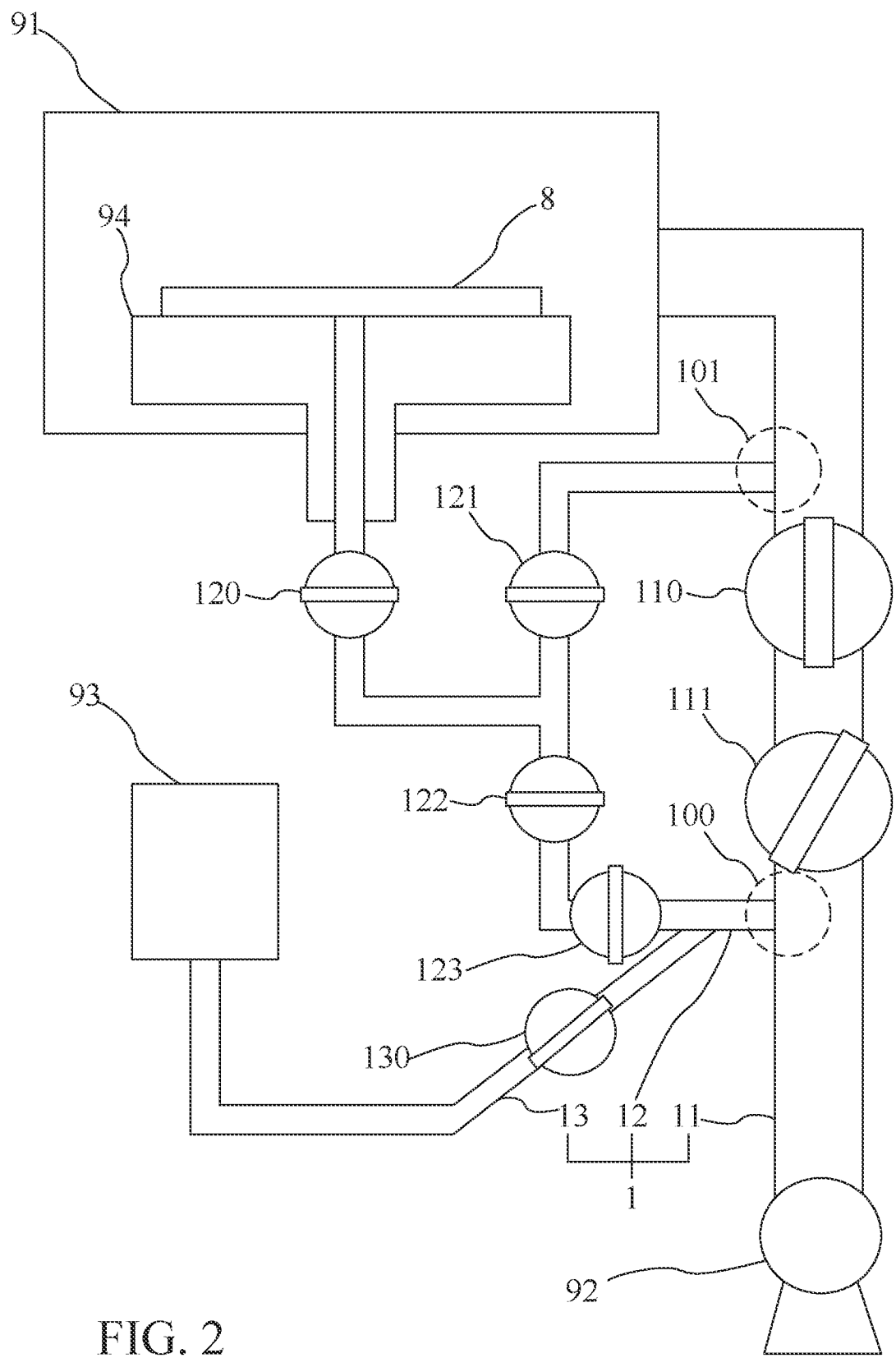
FIG. 2 is a schematic view of processing semiconductor wafer with a system according to some embodiments of the present disclosure.

Referring to FIG. 2, in some embodiments, the semiconductor wafer 8 may be placed on the platform 91. To prevent the semiconductor wafer 8 from being influenced by the gas provided from the gas source 93, the second pipe 12 may be blocked before the gas source 93 provides the gas via the third pipe 13. The valve 110 may be opened. The valve 111 may be adjusted to a specific position for controlling the gas flow in the first pipe 11 to a desired flow rate. The valves 120, 121, 122 and 123 of the second pipe 12 may be all closed. The valve 130 of the third pipe 13 may be opened.

Accordingly, the gas source 93 may then provide the gas via the third pipe 13 to purge the junction 100 of the first pipe 11 and the second pipe 12 without influencing the semiconductor wafer 8 placed in the chamber 91. The byproduct accumulated at the junction 100 may be wiped out. In some embodiments, the valve 130 of the third pipe 13 may be opened when a pressure in the chamber 91 is less than a specific millitorr. The specific millitorr may be about 50 to 150 millitorr.

Figure 3:
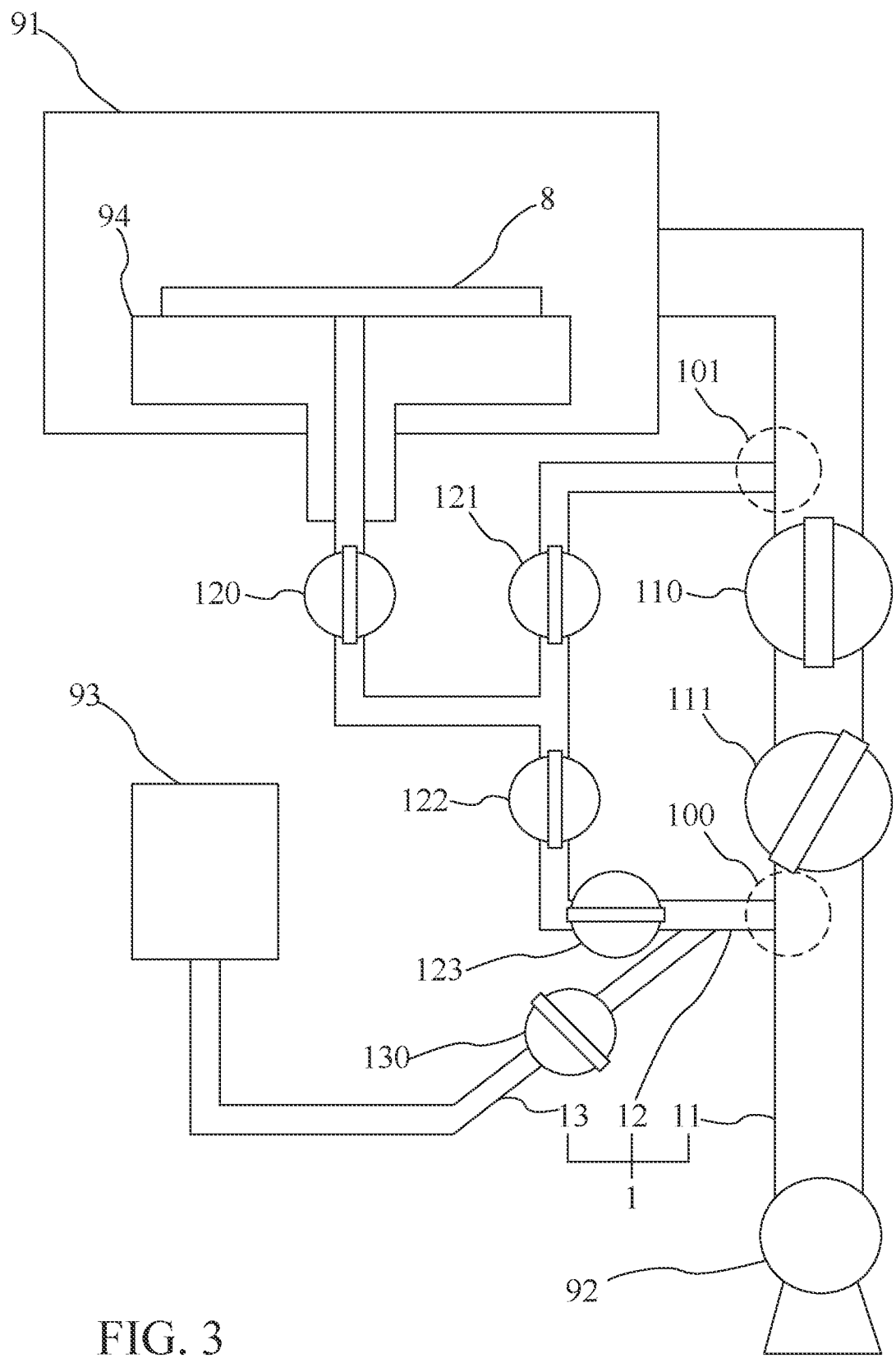
FIG. 3 is a schematic view of processing semiconductor wafer with a system according to some embodiments of the present disclosure.

Referring to FIG. 3, in some embodiments, while processing the semiconductor wafer 8, the semiconductor wafer 8 may be chucked by pumping down the second pipe 12. To prevent the semiconductor wafer 8 from being influenced during the processing procedure, the third pipe 13 may be blocked. The valve 110 may be opened. The valve 111 may be adjusted to a specific position for controlling the gas flow in the first pipe 11 to a desired flow rate. The valves 120, 121, 122 and 123 of the second pipe 12 may be all opened. The valve 130 of the third pipe 13 may be closed. Accordingly, the gas from the gas source 93 may be blocked. The gas may not be provided via the third pipe 13 to purge the junction 100 of the first pipe 11 and the second pipe 12. The semiconductor wafer 8 may not be influenced while being chucked.

Figure 4:
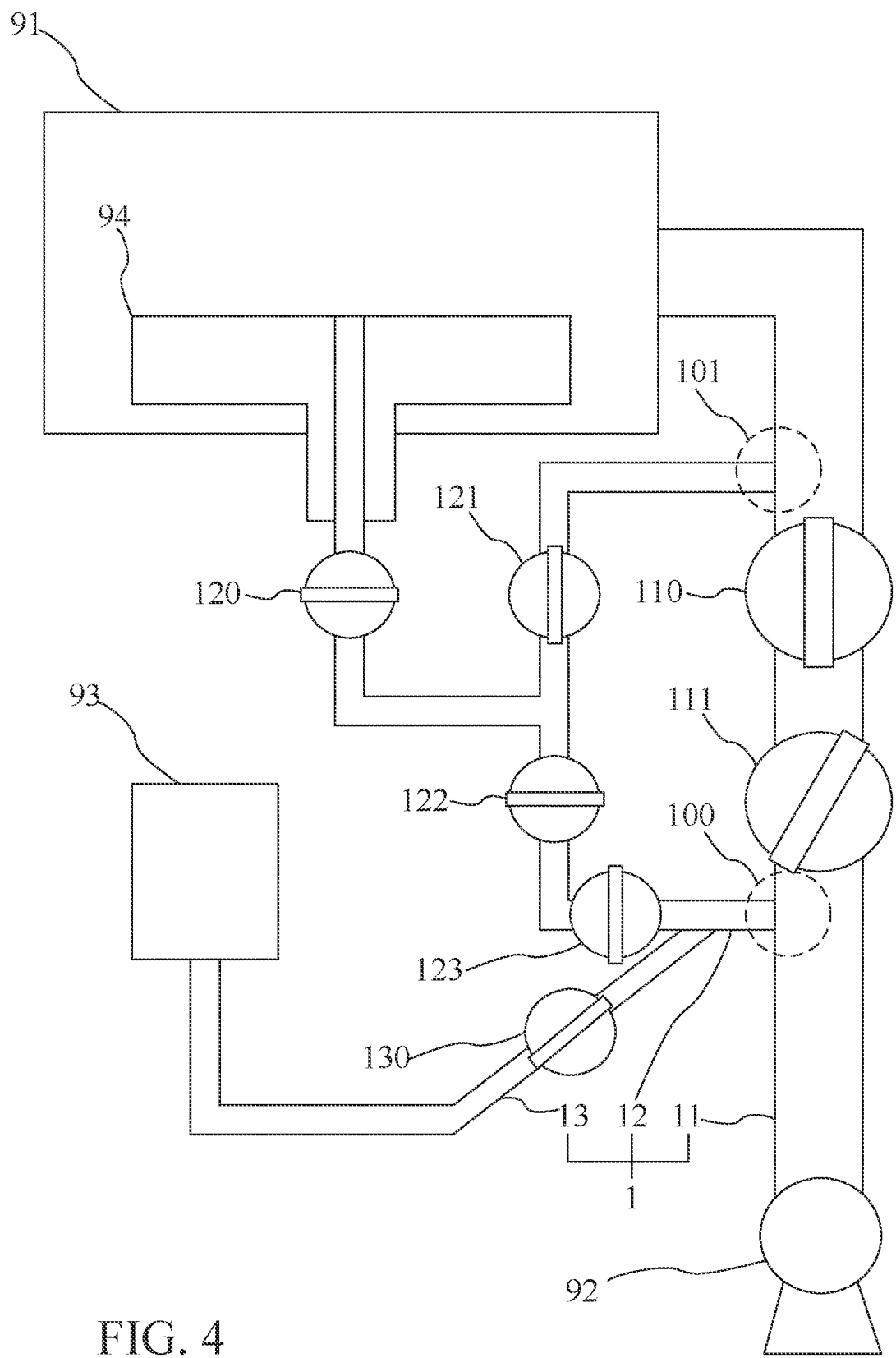
FIG. 4 is a schematic view of processing semiconductor wafer with a system according to some embodiments of the present disclosure.

Referring to FIG. 4, in some embodiments, the semiconductor wafer 8 may be removed from the chamber 91. The gas source 93 may provide the gas via the third pipe 13 to purge the junction 100. The valve 110 may be opened. The valve 111 may be adjusted to a specific position for controlling the gas flow in the first pipe 11 to a desired flow rate. The valves 120, 122 and 123 of the second pipe 12 may be closed. The valve 121 of the second pipe 12 may be opened. The valve 130 of the third pipe 13 may be opened. Accordingly, the gas source 93 may then provide the gas via the third pipe 13 to purge the junction 100 of the first pipe 11 and the second pipe 12 without influencing the chamber 91. The byproduct accumulated at the junction 100 may be wiped out.

Figure 5:
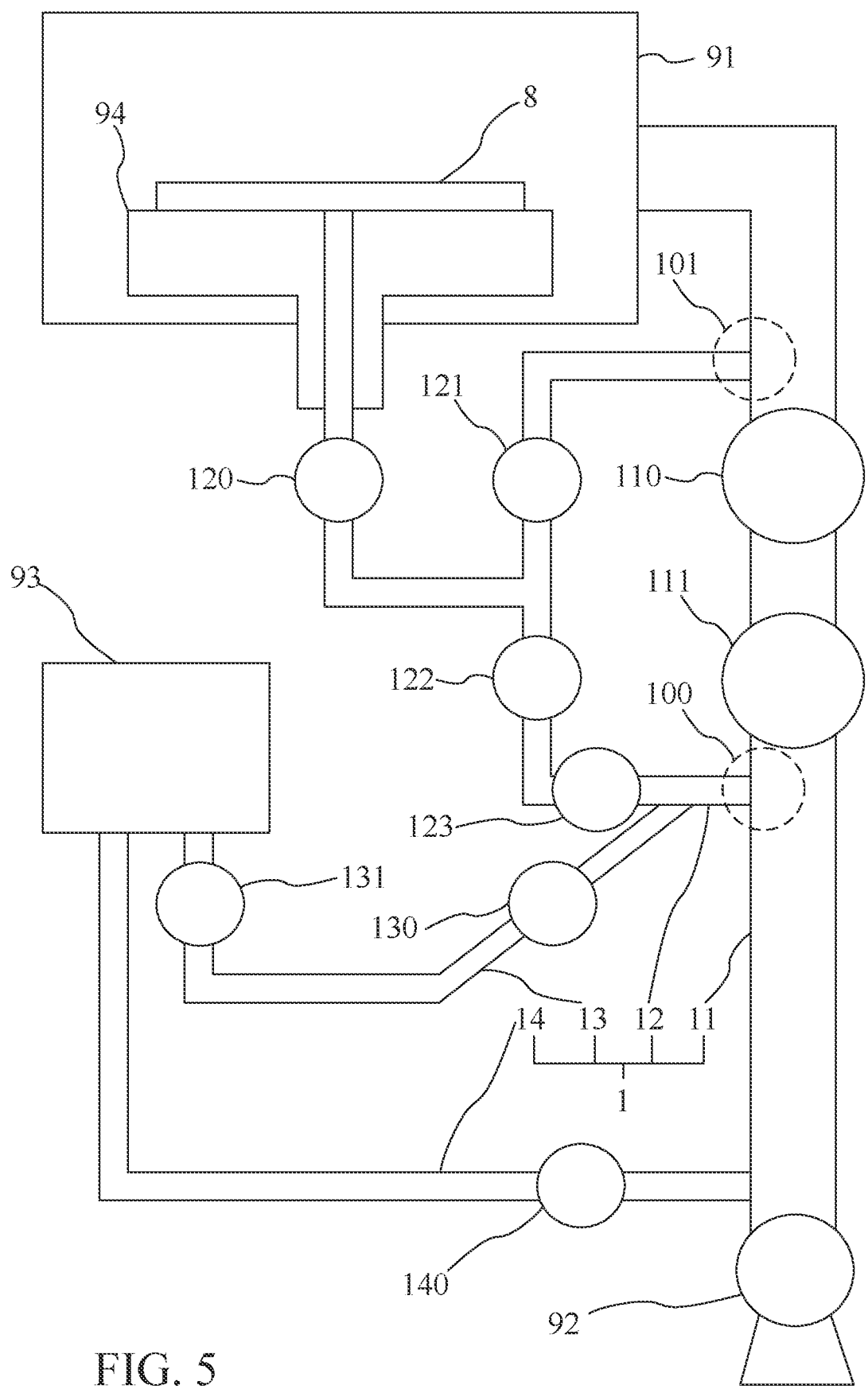
FIG. 5 is a schematic view of processing semiconductor wafer with a system according to some embodiments of the present disclosure.

Referring to FIG. 5, in some embodiments, the system 1 may further include a fourth pipe 14. The fourth pipe 14 may connect the first pipe 11 and the gas source 93. The third pipe 13 and the fourth pipe 14 may be independently connected to the gas source 93. The fourth pipe 14 may provide a fourth route for the gas flow between the gas source 93 and the first pipe 11.

The third pipe 13 may further be equipped with a valve 131. The valve 131 may be used as a pressure reducing valve for controlling the gas pressure provided from the gas source 93. For example, when the gas pressure for purging the junction 100 is too high, the second pipe 12 may be damaged. To prevent the second pipe 12 from being damaged by high gas pressure, the valve 131 of the third pipe 13 may be adjusted to control the gas provided from the gas source 93 under a specific psi. The specific psi may be about 4 to 6 psi. The fourth pipe 14 may be equipped with a valve 140. The valve 140 may be used as a ballast valve for controlling whether to ballast the first pipe 11 by the gas from the gas source 93.

Figure 6:
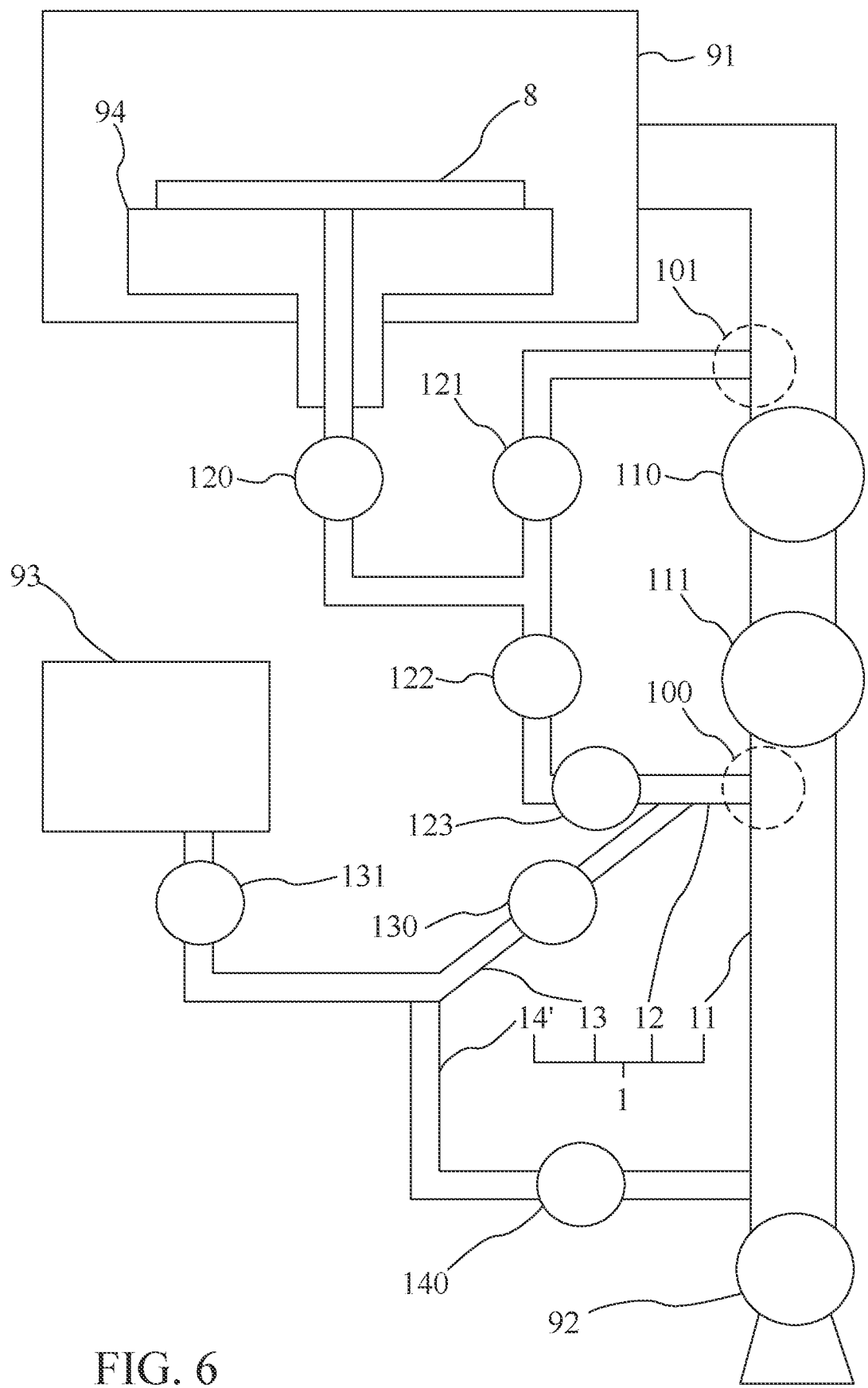
FIG. 6 is a schematic view of processing semiconductor wafer with a system according to some embodiments of the present disclosure.

Referring to FIG. 6, in some embodiments, the system 1 may further include a fourth pipe 14'. The fourth pipe 14' may connect the first pipe 11 and the third pipe 13. The fourth pipe 14' may provide a fourth route for the gas flow between the first pipe 11 and the third pipe 13. The third pipe 13 and the fourth pipe 14' may share the same gas source 93. When the gas source 93 provides the gas, the gas may: (1) purge the junction 100 of the first pipe 11 and the second pipe 12 via the third pipe 13; and (2) ballast the first pipe 11 via the fourth pipe 14'.

Figure 7:
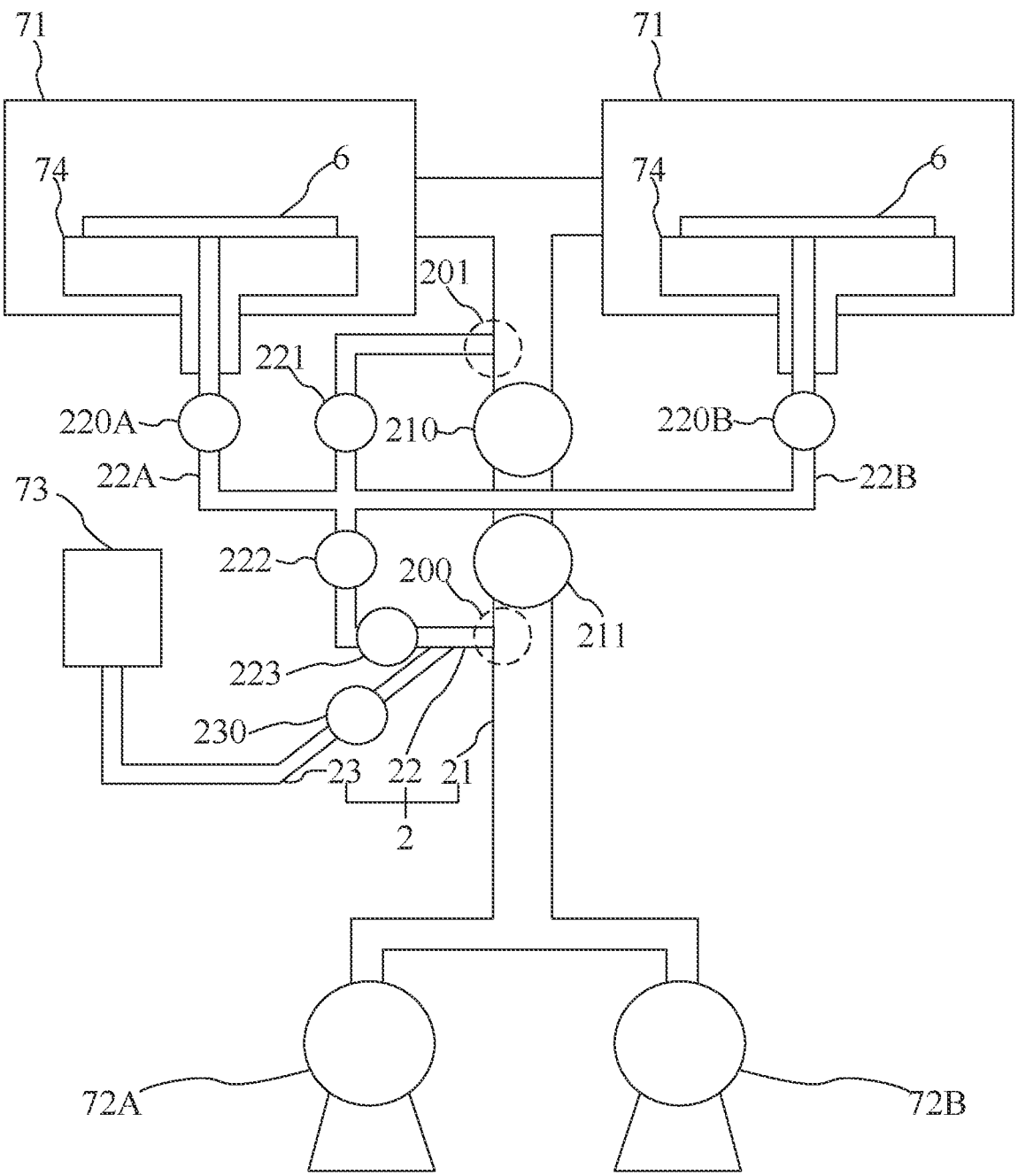
FIG. 7 is a schematic view of processing semiconductor wafer with a system according to some embodiments of the present disclosure.

Referring to FIG. 7 for some embodiments of the present disclosure, FIG. 7 is a schematic view of processing semiconductor wafer with a system 2 according to some embodiments of the present disclosure.

In some embodiments, two chambers 71 may be provided. The chambers 71 may receive semiconductor wafers 6 respectively. Each semiconductor wafer 6 may be placed on a platform 74 of the chamber 71. The semiconductor wafers 6 may be processed in the chambers 71. The system 2 may include a first pipe 21, a second pipe 22 and a third pipe 23. The first pipe 21 may connect the chambers 71 and a pump set. The pump set may include two pumps 72A and 72B. The second pipe 22 may connect the chambers 71 and the first pipe 21. The second pipe 22 may include two sub-pipes 22A and 22B for connecting the chambers 71 respectively. The third pipe 23 may connect the second pipe 22 and a gas source 73.

The first pipe 21 may provide a first route for the gas flow between the chambers 71 and the pumps 71A and 72B. The second pipe 22 may provide a second route for the gas flow between the chambers 71 and the first pipe 21. The second route may include two sub-routes. One of the sub-routes may connect one chamber 71 and the first pipe 21. The other of the sub-routes may connect the other chamber 71 and the first pipe 21. The third pipe 13 may provide a third route for the gas flow between the second pipe 22 and a gas source 73.

In some embodiments, for controlling the gas flow of the first route, the first pipe 21 may be equipped with valves 210 and 211. The valve 210 of the first pipe 21 may be used as an isolation valve for controlling the isolation of the gas flow between the chambers 71 and the pumps 72A and 72B. The valve 211 of the first pipe 21 may be used as a throttle valve for controlling the flow rate of the gas flow in the first pipe 21.

In some embodiments, for controlling the gas flow of the second route, the second pipe 22 may be equipped with valves 220A, 220B, 221, 222 and 223. The valves 220A and 220B may be used as chuck valves for controlling the chuck of the semiconductor wafers 6. The valve 221 may be used as a bypass valve 221. The valve 222 may be used as a vacuum valve for controlling whether the second pipe 22 to be pumped down. The valve 223 may be used as a lock valve for preventing gas from reversing back to the chambers 71.

In some embodiments, the third pipe 23 may be equipped with a valve 230. The valve 230 may be used as a lock valve for controlling the pass of the gas from the gas source 73.

In some embodiments, there may be two junctions (i.e., joins) 200, 201 of the first pipe 21 and the second pipe 22. The junction 201 may be close to the chambers 71. The junction 200 may be close to the pumps 72A and 72B. The valves 210 and 211 may be equipped between the junctions 200 and 201. The valves 220A and 220B may be equipped between the chambers 71 and the first pipe 21. The valve 221 may be equipped between the junction 201 and the valve 220A (or 220B). The valve 222 may be equipped between the junction 200 and the valve 220A (or 220B). The valve 223 may be equipped between the junction 200 and the valve 222. The valve 230 may be equipped between the junction 200 and the gas source 73.

In some embodiments, the pumps 72A and 72B may extract gases from the chambers 71 via the first pipe 21. In other words, the first pipe 21 may be configured for the pumps 72A and 72B to extract gases from the chambers 71. In some implementations, if one of the pumps 72A and 72B failed, the other one may keep extracting the gases from the chambers 71. Part of the second pipe 22 may be disposed within the platforms 74. When extracting gases from the chambers 71 via the first pipe 21, the pumps 72A and 72B may pump down the second pipe 22 for chucking the semiconductor wafers 6 placed on the platforms 74 in the chambers 71.

While processing the semiconductor wafers 6 in the chambers 71, gases may be provided into the chambers 71 for performing deposition of films on the semiconductor wafers 6. The deposition may include HARP in SACVD. During the said semiconductor wafers 6 processing procedures, byproduct may be generated. When the pumps 72A and 72B extracts the gas from the chambers 71 via the first pipe 21 and pumps down the second pipe 22 for chucking the semiconductor wafers 6, the byproduct may be flowed along the pipes 21 and 22.

In some embodiments, diameter of the second pipe 22 may be less than diameter of the first pipe 21. For instance, the diameter of the first pipe 21 may be about 6 inches and the diameter of the second pipe 22 may be about 0.6 inches. The byproduct may be accumulated at the junction 200 of the first pipe 21 and the second pipe 22.

In some embodiments, the gas source 73 may provide gas via the third pipe 23 to purge the junction 200 of the first pipe 21 and the second pipe 22 for wiping out the byproduct accumulated at the junction 200. In some implementations, one end of the third pipe 23 may be adjacent to the junction 200 of the first pipe 21 and the second pipe 22. According to different stages during the semiconductor wafers 6 processing procedures, the valves of the pipes may be opened or closed for different purposes.

Figure 8:
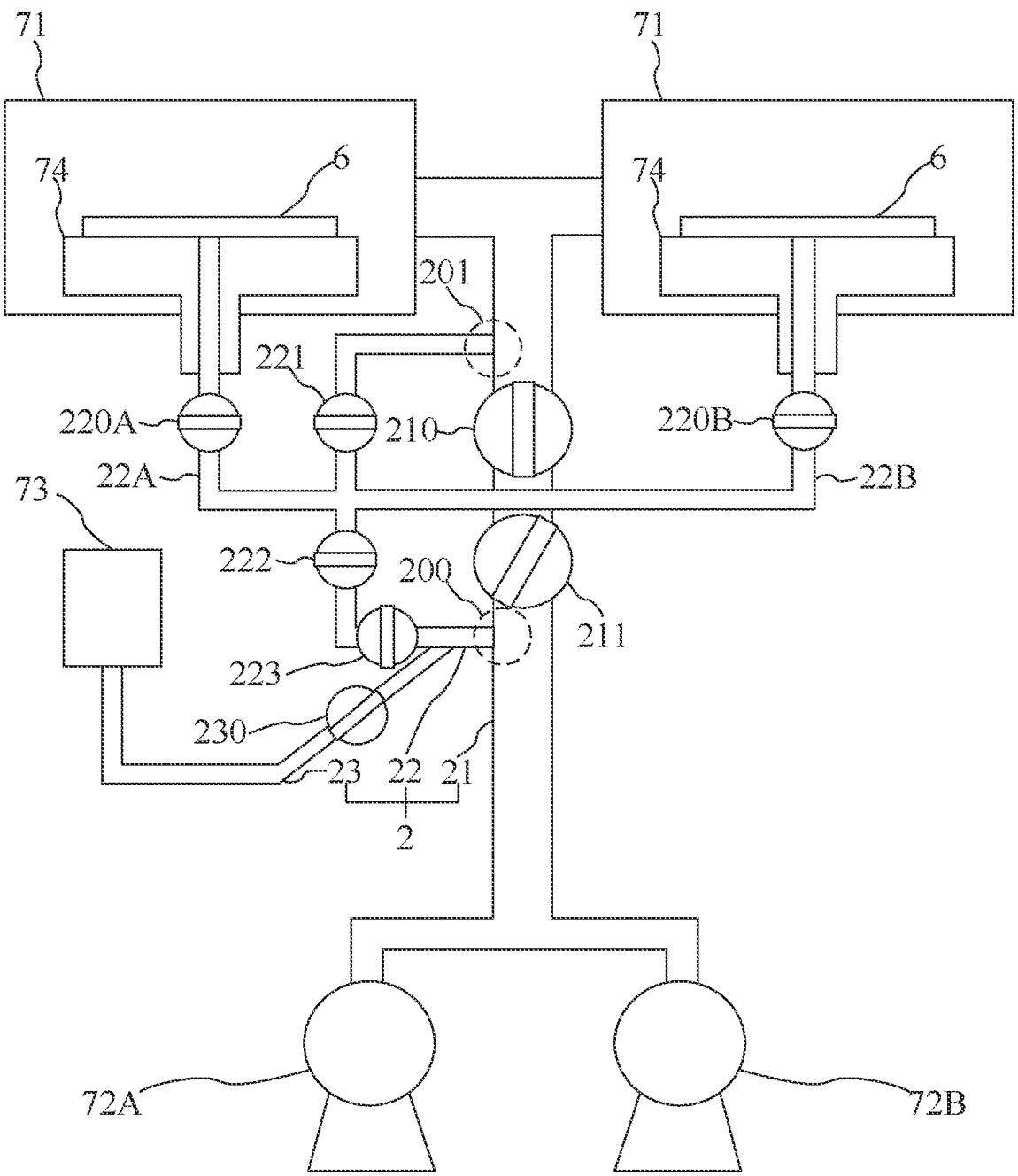
FIG. 8 is a schematic view of processing semiconductor wafer with a system according to some embodiments of the present disclosure.

Referring to FIG. 8, in some embodiments, the semiconductor wafers 6 may be placed on the platforms 71. To prevent the semiconductor wafers 6 from being influenced by the gas provided from the gas source 73, the second pipe 22 may be blocked before the gas source 73 provides the gas via the third pipe 23. The valve 210 may be opened. The valve 211 may be adjusted to a specific position for controlling the gas flow in the first pipe 21 to a desired flow rate. The valves 220A, 220B, 221, 222 and 223 of the second pipe 22 may be all closed. The valve 230 of the third pipe 23 may be opened.

Accordingly, the gas source 73 may then provide the gas via the third pipe 23 to purge the junction 200 of the first pipe 21 and the second pipe 22 without influencing the semiconductor wafers 6 placed in the chambers 71. The byproduct accumulated at the junction 200 may be wiped out. In some embodiments, the valve 230 of the third pipe 23 may be opened when pressures in the chambers 71 are all less than a specific millitorr. The specific millitorr may be about 100 millitorr.

Figure 9:
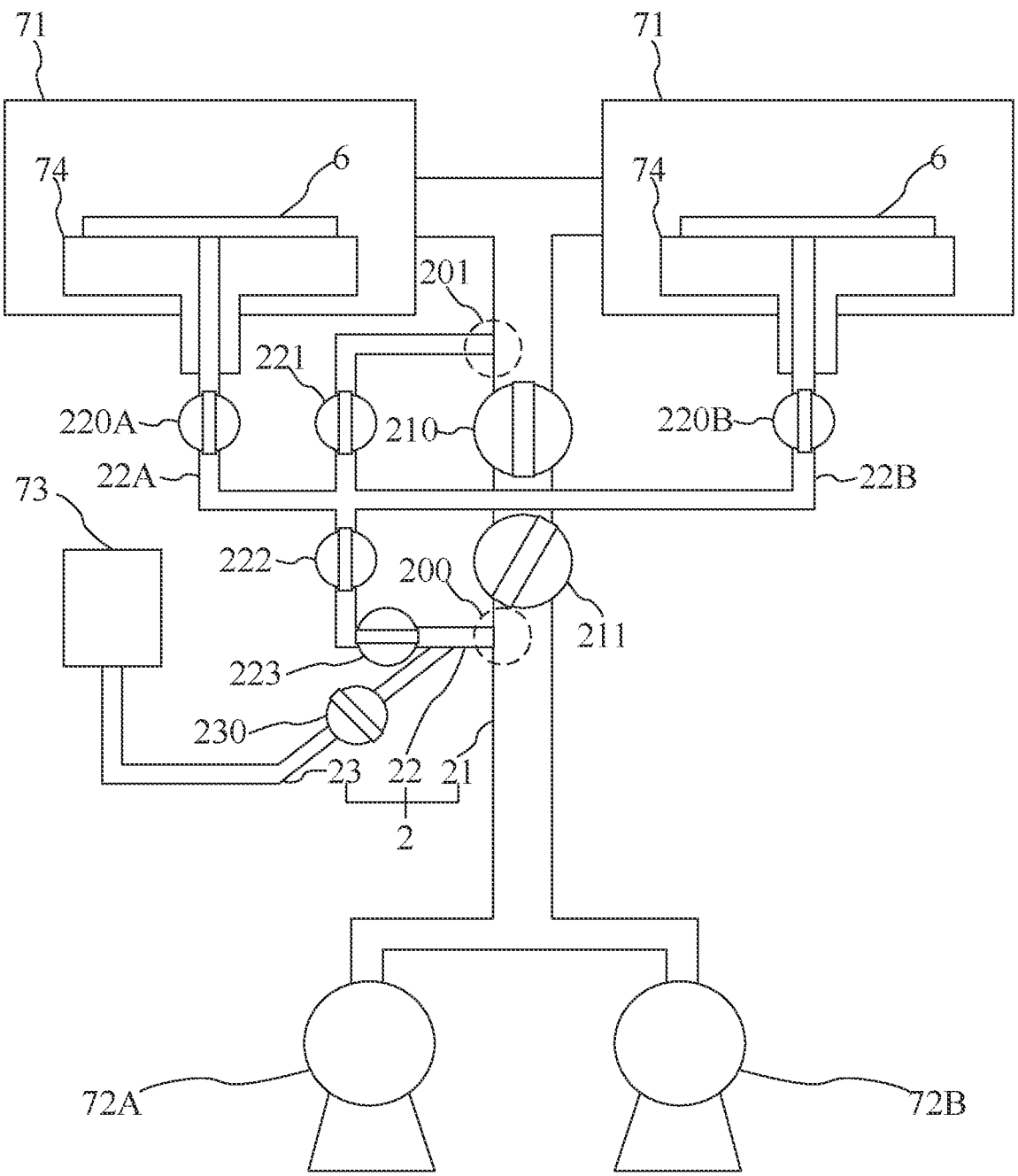
FIG. 9 is a schematic view of processing semiconductor wafer with a system according to some embodiments of the present disclosure.

Referring to FIG. 9, in some embodiments, while processing the semiconductor wafers 6, the semiconductor wafers 6 may be chucked by pumping down the second pipe 22. To prevent the semiconductor wafers 6 from being influenced during the processing procedure, the third pipe 23 may be blocked. The valve 210 may be opened. The valve 211 may be adjusted to a specific position for controlling the gas flow in the first pipe 21 to a desired flow rate. The valves 220A, 220B, 221, 222 and 223 of the second pipe 22 may be all opened. The valve 230 of the third pipe 23 may be closed. Accordingly, the gas from the gas source 73 may be blocked. The gas may not be provided via the third pipe 23 to purge the junction 200 of the first pipe 21 and the second pipe 22. The semiconductor wafers 6 may not be influenced while being chucked.

Figure 10:
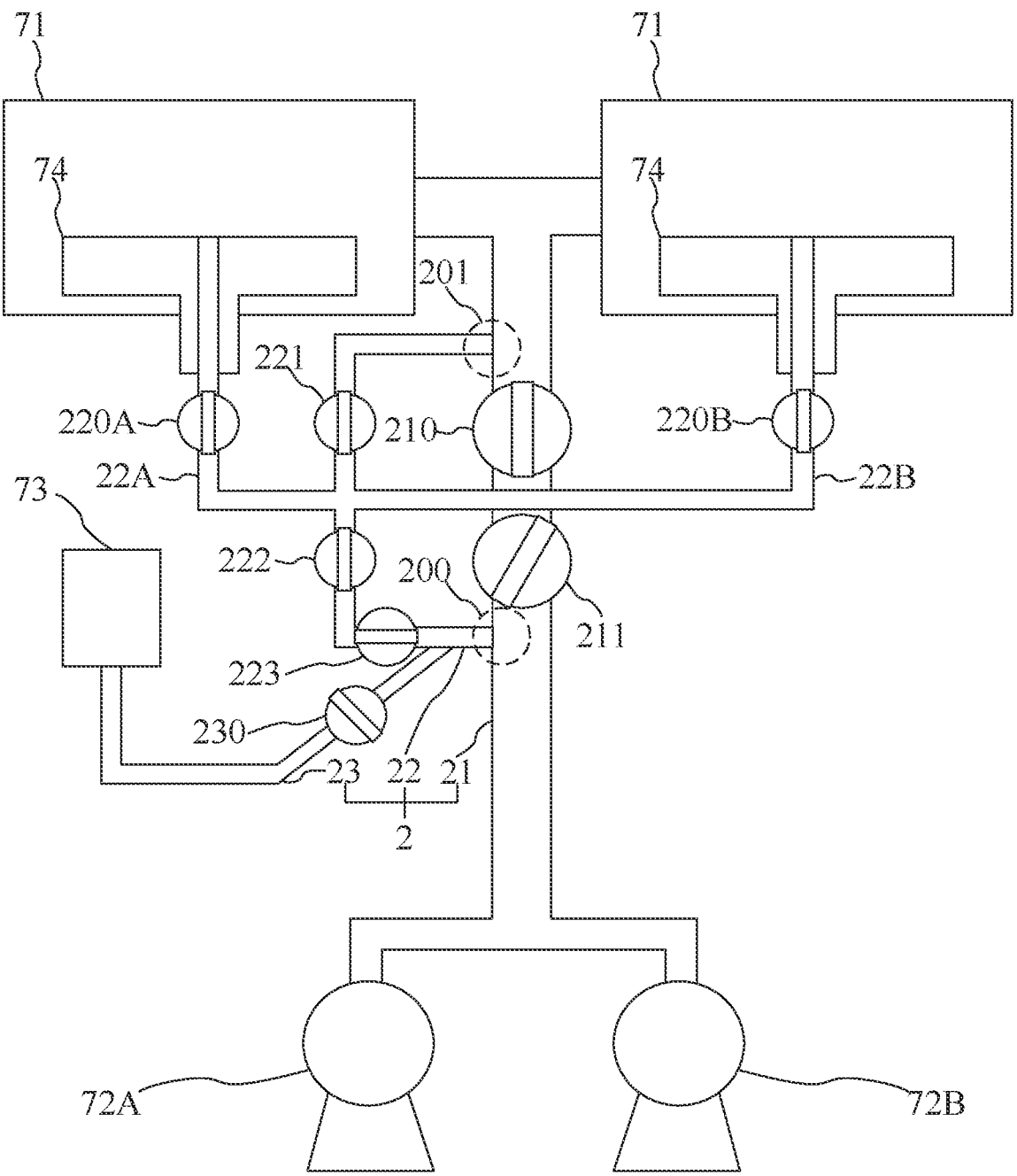
FIG. 10 is a schematic view of processing semiconductor wafer with a system according to some embodiments of the present disclosure.

Referring to FIG. 10, in some embodiments, the semiconductor wafers 6 may be removed from the chambers 71. The gas source 73 may provide the gas via the third pipe 23 to purge the junction 200. The valve 210 may be opened. The valve 211 may be adjusted to a specific position for controlling the gas flow in the first pipe 21 to a desired flow rate. The valves 220A, 220B, 222 and 223 of the second pipe 22 may be closed. The valve 221 of the second pipe 22 may be opened. The valve 230 of the third pipe 23 may be opened. Accordingly, the gas source 73 may then provide the gas via the third pipe 23 to purge the junction 200 of the first pipe 21 and the second pipe 22 without influencing the chambers 71. The byproduct accumulated at the junction 200 may be wiped out.

Figure 11:
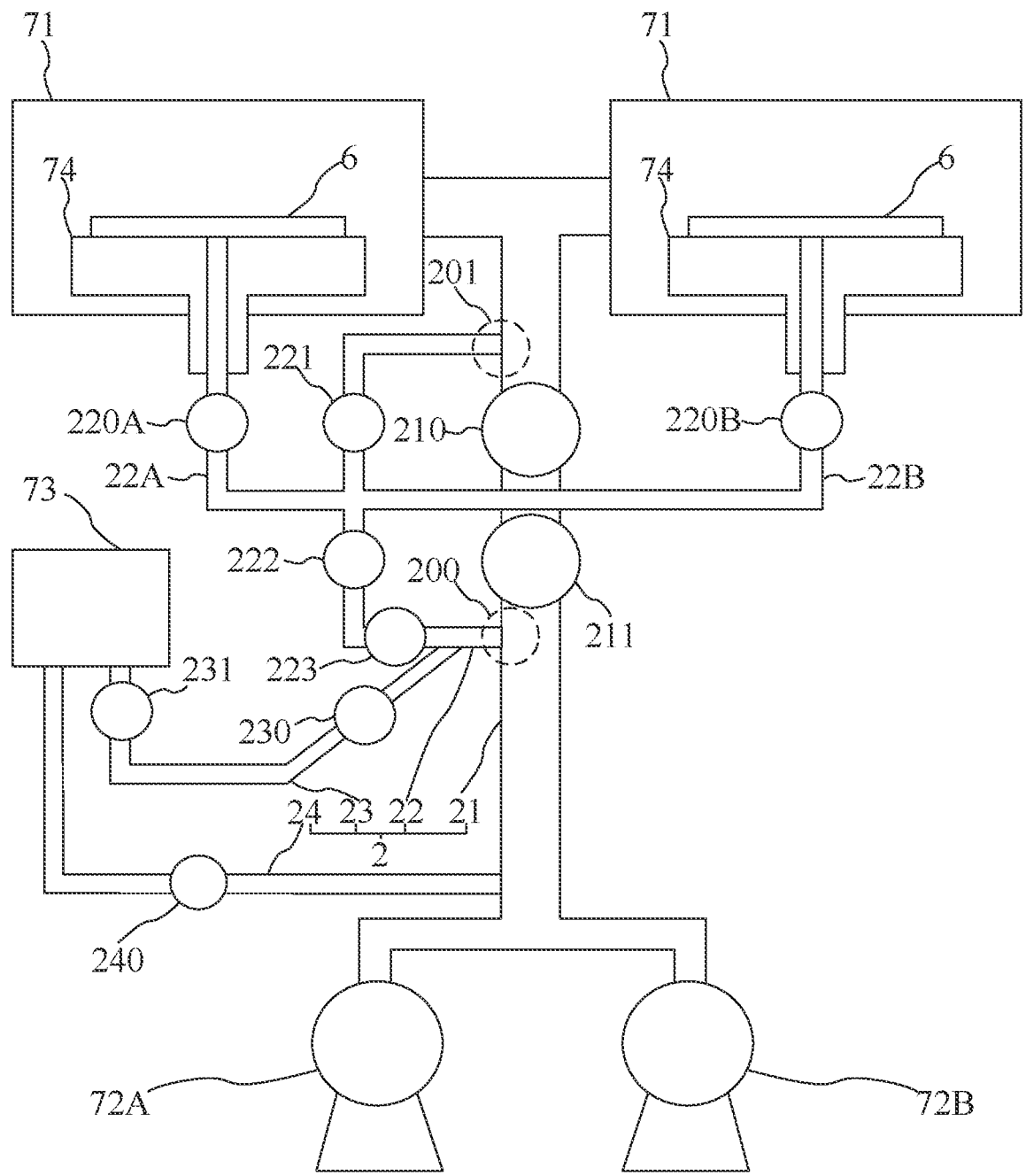
FIG. 11 is a schematic view of processing semiconductor wafer with a system according to some embodiments of the present disclosure.

Referring to FIG. 11, in some embodiments, the system 2 may further include a fourth pipe 24. The fourth pipe 24 may connect the first pipe 21 and the gas source 73. The third pipe 23 and the fourth pipe 24 may be independently connected to the gas source 73. The fourth pipe 24 may provide a fourth route for the gas flow between the gas source 73 and the first pipe 21.

The third pipe 23 may further be equipped with a valve 231. The valve 231 may be used as a pressure reducing valve for controlling the gas pressure provided from the gas source 73. For example, when the gas pressure for purging the junction 200 is too high, the second pipe 22 may be damaged. To prevent the second pipe 22 from being damaged by high gas pressure, the valve 231 of the third pipe 23 may be adjusted to control the gas provided from the gas source 73 under a specific psi. The specific psi may be about 5 psi. The fourth pipe 24 may be equipped with a valve 240. The valve 240 may be used as a ballast valve for controlling whether to ballast the first pipe 21 by the gas from the gas source 73.

Figure 12:
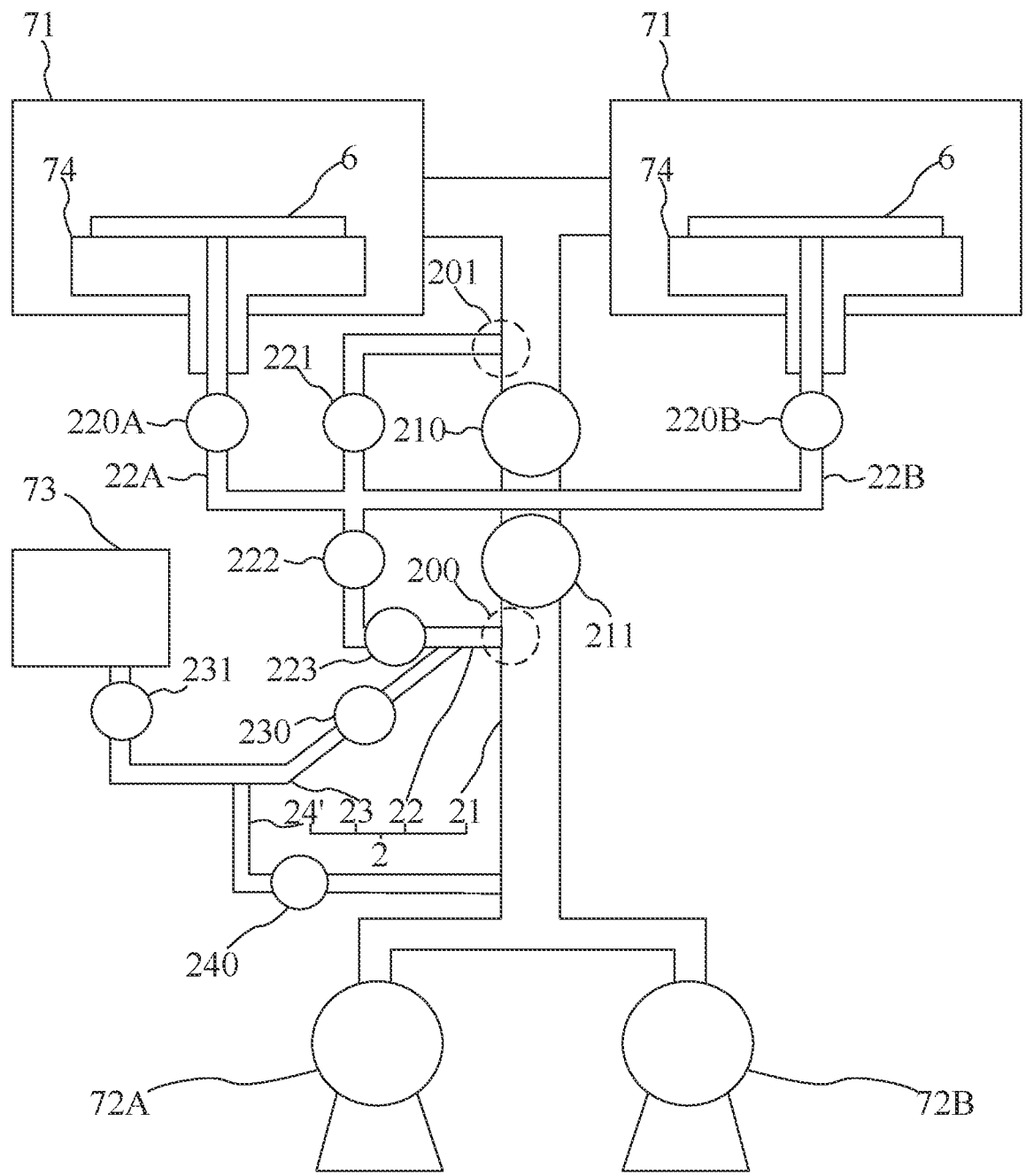
FIG. 12 is a schematic view of processing semiconductor wafer with a system according to some embodiments of the present disclosure.

Referring to FIG. 12, in some embodiments, the system 2 may further include a fourth pipe 24'. The fourth pipe 24' may connect the first pipe 21 and the third pipe 23. The fourth pipe 24' may provide a fourth route for the gas flow between the first pipe 21 and the third pipe 23. The third pipe 23 and the fourth pipe 24' may share the same gas source 73. When the gas source 73 provides the gas, the gas may: (1) purge the junction 200 of the first pipe 21 and the second pipe 22 via the third pipe 23; and (2) ballast the first pipe 21 via the fourth pipe 24'.

Figure 13:
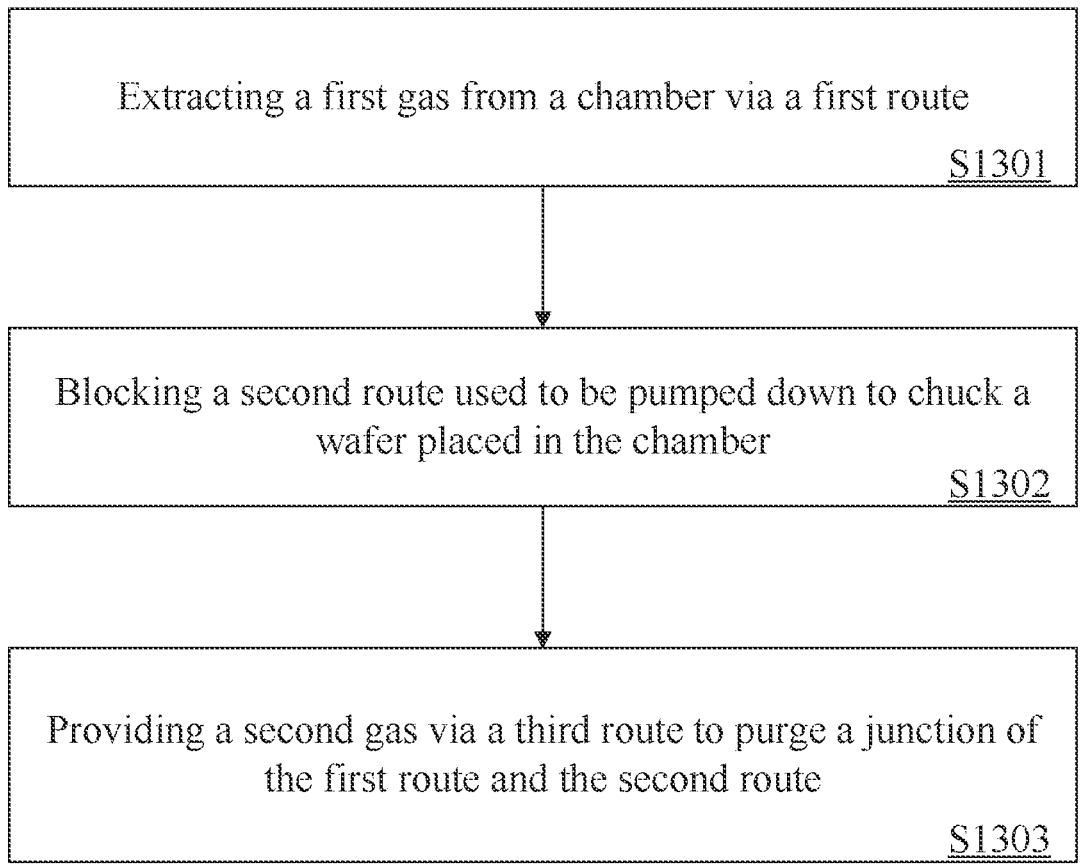
FIG. 13 is a flowchart diagram according to some embodiments of the present disclosure.

Some embodiments of the present disclosure include a method for processing wafer, and a flowchart diagram thereof is as shown in FIG. 13. The method of some embodiments may be implemented by a semiconductor manufacturing equipment and a system (e.g., the system 1 or 2 of the aforesaid embodiments). Detailed operations of the method are as follows.

Operation S1301 is performed to extract a first gas from a chamber via a first route. The gas is extracted from the chamber by a pump. The chamber and the first route are connected by a second route. The second route is used to be pumped down by the pump to chuck a wafer placed in the chamber. Operation S1302 is performed to block the second route. The second route is block by closing a valve of the second route. Operation S1303 is performed to provide a second gas via a third route to purge a junction of the first route and the second route. Byproduct accumulated at the junction of the first route and the second route may be wiped out by the purge of the second gas.

Figure 14A:
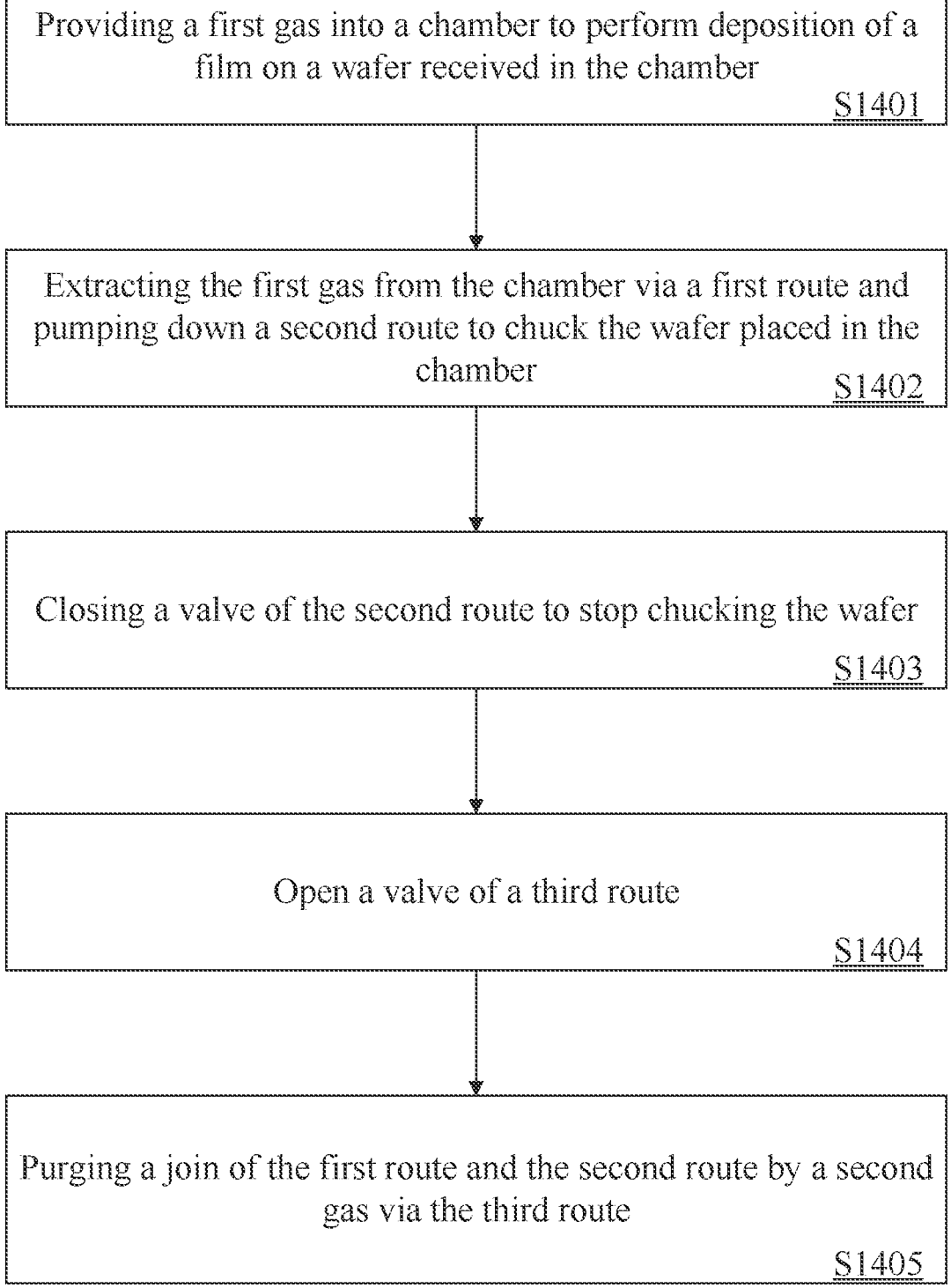

Some embodiments of the present disclosure include a method for processing wafer, and a flowchart diagram thereof is as shown in FIGS. 14A and 14B. The method of some embodiments may be implemented by a semiconductor manufacturing equipment and a system (e.g., the system 1 or 2 of the aforesaid embodiments). Detailed operations of the method are as follows.

Operation S1401 is performed provide a first gas into a chamber to perform deposition of a film on a wafer received in the chamber. The deposition may include HARP in SACVD. Operation S1402 is performed to extract the first gas from the chamber via a first route and to pump down a second route to chuck the wafer placed in the chamber. The first gas is extracted from the chamber by a pump set. The second route is pumped down to chuck to the wafer by the same pump set.

Operation S1403 is performed to close a valve of the second route to stop chucking the wafer. Operation S1404 is performed to open a valve of a third route. In some implementations, the valve of the third route is opened when pressures in the chamber is less than 100 millitorr. Operation S1405 is performed to purge a join of the first route and the second route by a second gas via the third route.

In some embodiments, operation S1406 is optionally performed to provide the second gas via a fourth route to ballast the first route. In some implementations, the third route and the fourth route may be connected. Therefore, operations S1405 and S1406 may be performed at the same time. In some implementations, the third route and the fourth route may be independent. Therefore, operations S1405 and S1406 may be performed separately. In some embodiments, operation S1407 is optionally performed to adjust another valve of the third route to provide the second gas under a specific psi (e.g., 4 to 6 psi).

Some embodiments of the present disclosure include a method for processing wafer, and a flowchart diagram thereof is as shown in FIGS. 15A and 15B. The method of some embodiments may be implemented by a semiconductor manufacturing equipment and a system (e.g., the system 1 or 2 of the aforesaid embodiments). Detailed operations of the method are as follows.

Operation S1501 is performed provide a first gas into chambers to perform depositions of films on wafers respectively received in the chambers. The depositions may include HARP in SACVD. Operation S1502 is performed to extract the first gas from the chambers via a first route and to pump down a second route to chuck the wafers placed in the chambers. The first gas is extracted from the chambers by a pump set. The second route includes two sub-routes. One of the sub-routes connects one of the chambers and the first route. The other of the sub-routes connects the other chamber and the first route. The second route is pumped down to chuck to the wafers by the same pump set.

Operation S1503 is performed to close a valve of the second route to stop chucking the wafers. Operation S1504 is performed to open a valve of a third route. In some implementations, the valve of the third route is opened when pressures in the chambers are all less than 100 millitorr. Operation S1505 is performed to purge a join of the first route and the second route by a second gas via the third route.

In some embodiments, operation S1506 is optionally performed to provide the second gas via a fourth route to ballast the first route. In some implementations, the third route and the fourth route may be connected. Therefore, operations S1505 and S1506 may be performed at the same time. In some implementations, the third route and the fourth route may be independent. Therefore, operations S1505 and S1506 may be performed separately. In some embodiments, operation S1507 is optionally performed to adjust another valve of the third route to provide the second gas under a specific psi (e.g., 5 psi).

Some embodiments of the present disclosure provide a method for processing wafer. The method includes the operations of: extracting a first gas from a chamber via a first route; blocking a second route used to be pumped down to chuck a wafer placed in the chamber, wherein the second route connects the chamber and the first route; and providing a second gas via a third route to purge a junction of the first route and the second route.

Some embodiments of the present disclosure provide a method of processing wafer. The method includes the operations of: providing a pump for extracting gas from a chamber via a first route and pumping down a second route to chuck a wafer placed in the chamber; closing a valve of the second route to stop chucking the wafer; and purging a join of the first route and the second route by another gas.

Some embodiments of the present disclosure provide a system for processing wafer. The system includes: a first pipe, connecting a chamber and a pump, and configured for the pump to extract gas from the chamber; a second pipe, connecting the chamber and the first pipe, and configured to be pumped down by the pump for chucking a wafer placed in the chamber; and a third pipe, connecting the second pipe and a gas source, and configured for the gas source to provide gas to purge a junction of the first pipe and the second pipe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for processing wafer, comprising:
   extracting a first gas from a chamber via a first route;
   blocking a second route used to be pumped down to chuck a wafer placed in the chamber, wherein the second route connects the chamber and the first route, and the wafer is positioned adjacent to a first end of the second route; and
   providing a second gas via a third route to purge a junction of the first route and a second end of the second route when the second route is blocked, wherein the second end is opposite the first end, and a junction of the third route and the second route is adjacent to the second end of the second route.

2. The method of claim 1, further comprising:
   pumping down the second route to chuck the wafer placed in the chamber.

3. The method of claim 2, wherein the first gas is extracted from the chamber via the first route by a pump set, and the second route is pumped down to chuck the wafer by the same pump set.

4. The method of claim 1, further comprising:
   providing the first gas into the chamber to perform a deposition of a film on the wafer.

5. The method of claim 4, wherein the deposition includes high aspect ratio process in sub-atmosphere chemical vapor deposition.

6. The method of claim 1, wherein step of providing the second gas via the third route to purge the junction of the first route and the second route further comprises:
   providing the second gas via the third route to purge the junction of the first route and the second route, and via a fourth route to ballast the first route, wherein the third route and the fourth route are connected.

7. The method of claim 1, further comprising:
   providing a third gas via a fourth route to ballast the first route, wherein the third route and the fourth route are independent.

8. The method of claim 1, wherein the second gas is provided under 5 psi via the third route.

9. The method of claim 1, further comprising:
   extracting the first gas from another chamber via the first route.

10. The method of claim 9, wherein the second route is further used to be pumped down to chuck another wafer placed in the another chamber.

11. The method of claim 10, wherein the second route comprises two sub-routes, one of the sub-routes connects the chamber and the first route and another of the sub-routes connects the another chamber and the first route.

12. A method of processing wafer, comprising:
   providing a pump for extracting gas from a chamber via a first route and pumping down a second route to chuck a wafer placed in the chamber, wherein the wafer is positioned adjacent to a first end of the second route;
   closing a valve of the second route to stop chucking the wafer; and
   purging a join of the first route and a second end of the second route by another gas via a third route when the valve of the second route is closed, wherein the second end is opposite the first end, and a junction of the third route and the second route is adjacent to the second end of the second route.

13. The method of claim 12, wherein the third route is equipped with a pressure reducing valve to adjust and control the another gas during purging the join of the first route and the second route.

14. The method of claim 12, further comprising:
   opening a valve of the third route.

15. The method of claim 14, wherein the valve of the third route is opened when a pressure in the chamber is less than 100 millitorr.

16. The method of claim 14, further comprising:
   adjusting another valve of the third route to provide the another gas under 5 psi.

17. The method of claim 12, wherein the another gas includes nitrogen.

18. A method for processing wafer, comprising:
   providing a first gas into a chamber to perform a deposition of a film on the wafer;
   extracting the first gas from the chamber via a first route and pumping down a second route to chuck the wafer placed in the chamber, wherein the wafer is positioned adjacent to a first end of the second route;
   closing a valve of the second route to stop chucking the wafer;
   opening a valve of a third route; and
   purging a join of the first route and a second end of the second route by a second gas via the third route, wherein the second end is opposite the first end, and a junction of the third route and the second route is adjacent to the second end of the second route.

19. The method of claim 18, further comprising:
   providing the second gas via a fourth route to ballast the first route.

20. The method of claim 18, further comprising:
adjusting another valve of the third route to provide the second gas under a specific psi.

\* \* \* \* \*